(12) United States Patent
Hind et al.

(10) Patent No.: US 9,030,337 B2
(45) Date of Patent: May 12, 2015

(54) MULTI-BRANCH DOWN CONVERTING FRACTIONAL RATE CHANGE FILTER

(71) Applicant: Telefonaktiebolaget L M Ericsson (Publ), Stockholm (SE)

(72) Inventors: Joleen Hind, Ottawa (CA); Pierre-André Laporte, Gatineau (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/047,528

(22) Filed: Oct. 7, 2013

(65) Prior Publication Data
US 2015/0098526 A1 Apr. 9, 2015

(51) Int. Cl.
*H03H 17/06* (2006.01)
*H03H 17/04* (2006.01)
*H04L 25/02* (2006.01)

(52) U.S. Cl.
CPC ....... *H04L 25/0262* (2013.01); *H03H 17/0621* (2013.01); *H03H 17/0416* (2013.01)

(58) Field of Classification Search
CPC ....... H03H 17/0219; H03H 17/0273–17/0276; H03M 7/00
USPC ............................................ 341/61; 708/313
See application file for complete search history.

(56) References Cited

U.S. PATENT DOCUMENTS

| | | | |
|---|---|---|---|
| 5,500,811 A * | 3/1996 | Corry ............................ | 708/319 |
| 5,613,084 A * | 3/1997 | Hau et al. ...................... | 711/219 |
| 6,057,793 A | 5/2000 | Gong et al. | |
| 6,452,982 B1 | 9/2002 | O'Dell et al. | |
| 7,136,430 B2 | 11/2006 | Morris et al. | |
| 7,196,650 B1 | 3/2007 | Hand et al. | |
| 7,236,110 B2 | 6/2007 | Antonesei | |
| 7,466,247 B1 | 12/2008 | Gorbics | |
| 8,289,195 B1 | 10/2012 | Dong et al. | |
| 8,416,111 B2 | 4/2013 | Pagnanelli | |
| 2003/0053558 A1 | 3/2003 | Unger et al. | |
| 2004/0263363 A1 * | 12/2004 | Biswas .......................... | 341/61 |
| 2005/0160124 A1 | 7/2005 | Bisiaux | |
| 2008/0198914 A1 * | 8/2008 | Song ............................. | 375/232 |
| 2012/0041995 A1 | 2/2012 | Laporte | |

FOREIGN PATENT DOCUMENTS

EP 2369362 A1 9/2011

OTHER PUBLICATIONS

Retrieved from the Internet Jul. 3, 2013: < URL: http://www.xilinx.com/support/documentation/application_notes/xapp936 consisting of 11-pages.
International Search Report and Written Opinion dated Dec. 5, 2014 for International Serial No. PCT/IB2014/063436, International Filing Date: Jul. 25, 2014 consisting of 15-pages.
John G. Proakis et al., "Introduction to Digital Signal Processing" in: "Introduction to Digital Signal Processing", Macmillan Publishing Company, Singapore XP055152852, ISBN: 0-02-946253-3 pp. 660-671, Jan. 1, 1993 consisting of 14-pages.

* cited by examiner

*Primary Examiner* — Howard Williams
(74) *Attorney, Agent, or Firm* — Christopher & Weisberg, P.A.

(57) ABSTRACT

A method of filtering an input sample stream having a down-sampling rate is disclosed to generate an output sample stream having an upsampling rate that is less than the down-sampling rate. The input sample stream is input to a rate change filter having multiple filter branches. The input sample stream is filtered at each of the multiple filter branches to output filtered sample substreams. Each of the multiple filter branches have filter coefficients corresponding to a different phase of the filter response. The filtered sample substreams are stored in a memory and the stored filtered sample substreams are combined to generate the output sample stream.

19 Claims, 10 Drawing Sheets

MULTI-BRANCH DOWN CONVERTING FRACTIONAL RATE CHANGE FILTER

TECHNICAL FIELD

The present invention relates to digital signal processing, and more specifically, to multi-rate digital signal processing systems and methods.

BACKGROUND

In almost every activity involving electrical devices, some manner of data transmission is necessary to enable communication between the devices. This communication may be transmitted between the devices over a communication channel such as copper wires, optical fibers, wireless communication channels and storage media. The transmitted data may be represented as an electromagnetic signal such as, for example, an electrical voltage, radio wave, microwave or an infrared signal. The signal may be transmitted as an analog signal, which is a transfer of a continuously varying signal, or the signal may be transmitted as a digital signal, which is a transfer of discrete messages that may be represented as a code modulated on the transmission carrier as, for example, a baseband transmission or a passband transmission. The discrete messages may be represented as a bit stream or a digitized analog signal.

In many communication systems, a signal transmitted from a sending device to a receiving device often involves transmission of the signal across different communication media. Such a hybrid transmission path may sometimes require that different data rates be transmitted on particular media due to different capabilities of the media, different quality of service (QoS) requirements or different service level agreements, for example. Sometimes a signal transmitted from a sending device to a receiving device includes traversal of only a single communication medium, but an amount of data provided by the sending device may exceed a capacity of the communication medium.

In that regard, there can be a need to convert the sampling rate of a digital signal from a higher to a lower sampling rate to reduce processing speed requirements or resources. A rational fraction rate change of $$\frac{U}{D}$$

can be implemented by first up-sampling by a sample rate U, then by filtering the interpolated signal to remove the interpolation images and finally down-sampling by a sample rate D. However, this is not an efficient method to implement in hardware as it may require higher processing speeds and more resources to initially up-sample the signal by a factor of U than the hardware will support or is economically feasible.

Changes to sampling rates can be efficiently implemented through a digital filter called a polyphase Finite Impulse Response (FIR) Rate Change Filter (RCF). The RCF may be implemented as a polyphase FIR filter, in which every output sample y(m) is generated by multiplying the input stream with a subset (phase) of the filter coefficients and summing the resulting products according to the following equation:

$$y(m) = \sum_{n=0}^{Ntap-1} h\left(nU + mD - \left\lfloor \frac{mD}{U} \right\rfloor U\right) \times x\left(\left\lfloor \frac{mD}{U} \right\rfloor - n\right), \quad \text{(Eq. 1)}$$

$$m \in \left[0 : \left\lceil \frac{L_x \times U}{D} \right\rceil - 1\right].$$

Where:
Ntap is the number of taps, i.e., the number of coefficients per phase;
h is the filter impulse response;
x is the input stream;
y is the output stream;
U is the up-sampling factor;
D is the down-sampling factor;
Lx is the length of the input stream x;
m is the index of output stream y, with length $$\left\lceil \frac{L_x \times U}{D} \right\rceil;$$

n is the filter tap index;
$\lfloor a \rfloor$ is the rounding function towards minus infinity, i.e., the floor function; and
$\lceil a \rceil$ is the rounding function towards plus infinity, i.e., the ceiling function.

The up-sampling and down-sampling factors are simply determined by the ratio of the filter input and output sample rates. For example, a stream having rate changed from 500 MHz to 400 MHz, the U and D factors could be any combination of integers that produces a ratio of 0.80. The up-sampling and down-sampling factors could be, for example: U=40 and D=50. The length of the filter impulse response is partly determined by the up-sampling factor:

$$\text{Filter impulse response length} = Ntap \times U. \quad \text{(Eq. 2):}$$

In recent communication systems, sample data rates are becoming faster, while requiring complex digital signal processing functions. These rates can be too fast to be realizable in digital hardware using a direct method of implementation in existing technologies such as Application Specific Integrated Circuits (ASICs) and Field Programmable Gate Arrays (FPGAs).

When the procession speed required exceeds the hardware limitations, direct form implementation of the Fractional RCF, as discussed above, is not a viable solution. Therefore parallel branching of the data paths may be used to reduce the required internal processing speed of the hardware, but at the expense of resources. In this invention of a Fractional Rate Change Filter with an $$\frac{U}{D}$$

ratio of less than one, the signal processing functions must be modified at the algorithm level to implement parallel branching. An output rate of a polyphase Finite Impulse Response (FIR) Rate Change Filter is limited by the operating speed of the hardware. Further, control and coordination of the branches of the hardware resources requires specialized handling.

SUMMARY

The present invention relates to using a multi-branch finite impulse response filter to convert the sampling rate of a digital signal from a higher to a lower sampling rate. In accordance with one embodiment, a method of filtering an input sample stream having a downsampling rate to generate an output sample stream having an upsampling rate less than the downsampling rate includes inputting the input sample stream to a rate change filter that has multiple filter branches. The input sample stream is filtered at each of the multiple filter branches to output filtered sample substreams, wherein each of the multiple filter branches have filter coefficients that correspond to a different phase of the filter response. The filtered sample substreams are stored in a memory. The stored output sample substreams are combined to generate the output sample stream.

In accordance with an aspect of this embodiment, filtering the input sample stream at each of the multiple filter branches includes multiplying, during successive taps of a clock cycle, the input sample stream input of each filter branch by a set of filter coefficients to generate a set of products. The set of products is combined to generate a filter output signal for a respective filter branch. In accordance with another aspect of this embodiment, filtering the input sample stream in each of the multiple filter branches includes delaying the successive taps of each filter branch. The filter output signals from each respective branch are interleaved. In accordance with yet another aspect of this embodiment, the multiple filter branches include a finite impulse response filter. Delaying the successive taps includes including a first delay in an output of successive taps of each branch of the multiple branches to account for filter pipelining delays. Second delays are included in successive taps of each branch to account for a phase delay between taps of each branch of the multiple filter branches.

In accordance with still another aspect of this embodiment, storing the filtered sample substreams in memory includes determining whether an output sample of a filtered sample substream is valid based on an index of the input sample stream. The filter coefficients correspond to taps of each branch of the multiple filter branches. An index of the output sample stream is incremented if the output sample of the filter branch is valid. In accordance with an aspect of this embodiment, determining whether an output sample is valid is based on an index of the input sample stream, the upsampling rate and the downsampling rate. In accordance with another aspect of this embodiment, determining whether the output sample is valid is determined by $$\text{valid}_y(k) = \left\lceil \frac{(k+1)U}{D} \right\rceil - \left\lceil \frac{kU}{D} \right\rceil,$$

wherein k is the index of the input sample stream; U is the upsampling rate; D is the downsampling rate; y is the output stream; and $\lceil x \rceil$ is a ceiling function on x.

In accordance with yet another aspect of this embodiment, storing the generated output sample substreams in the memory includes storing the generated sample substreams in multiple output buffers. The multiple output buffers correspond to the multiple filter branches. Storing the generated output sample substreams include determining an index of the output sample substream. The determined index is used as a memory address of the multiple output buffers. The stored output sample substream is output from the memory address of the determined index as an output value. In accordance with still another aspect of this embodiment, the generated output sample substreams are stored in multiple output buffers. The multiple output buffers correspond to the multiple filter branches. The determination that the output sample of the input sample stream is valid is used as write control logic to determine which buffer address to write the filter branch outputs.

In accordance with another embodiment, a rate change filter for filtering an input sample stream having a first sample rate to generate an output stream having a second sample rate less than the first sample rate includes multiple branches of a rate change filter. Each of the multiple branches has an offset state to filter the input sample stream using filter coefficients in each branch corresponding to different phases and to generate multiple output substreams. An input control circuit is configured to control input of the input sample stream to each of the multiple branches of the rate change filter. A filter control circuit is configured to control filter coefficients of the rate change filter to output filtered sample substreams. An output control circuit is configured to control output of sample substreams generated at each of the multiple branches of the rate change filter.

In accordance with an aspect of this embodiment, each branch of the multiple filter branches is configured to multiply, during successive taps of a clock cycle, the input sample stream fed to each filter branch by a set of filter coefficients to generate a set of products and combine the set of products to generate a filtered output substream for a respective branch. In accordance with another aspect of this embodiment, each branch of the multiple filter branches is further configured to delay successive taps of each branch. First delays are included in an output of each of the successive taps of each branch to account for filter pipelining delays. Second delays are included in an input of each of the successive taps of each branch to account for a phase delay between respective branches of the multiple filter branches. The output signals from each respective branch are interleaved. In accordance with yet another aspect of this embodiment, the output control circuit is further configured to determine whether an output sample is valid. The coefficient index of each branch of the multiple branches is updated. An index of the output sample stream is incremented if the output sample is valid.

In accordance with still another aspect of this embodiment, the output control circuit is further configured to determine whether an output sample is valid based on an index of the input sample stream, the first sample rate and the second sample rate. In accordance with an aspect of this embodiment, the output control circuit is further configured to store the generated output sample substreams in multiple output buffers, the multiple output buffers corresponding to the multiple filter branches of the rate change filter. In accordance with another aspect of this embodiment, the output control circuit is further configured to store the generated output sample substreams by determining an index of the output sample substream. The determined index is used as a memory address of the multiple output buffers. The stored output sample substream is output from the memory address of the determined index as an output value. In accordance with yet another aspect of this embodiment, the output control circuit is further configured to store the generated output sample substreams in multiple output buffers, the multiple output buffers corresponding to the multiple filter branches. The determination that the output sample is valid is used in determining when and to which buffer to write the filter branch outputs.

A method of filtering an input sample stream having a first sample rate to generate an output sample stream having a second sample rate less than the first sample rate includes inputting the input sample stream to a rate change filter having multiple filter branches. The input sample stream is filtered at each of the multiple filter branches to output filtered sample substreams. Each of the multiple filter branches has filter coefficients corresponding to a different phase of the filter response. The filtering includes multiplying, during successive taps of a clock cycle, the input sample stream input to each filter branch by a set of filter coefficient to generate a set of products. The set of products are combined to generate a filter output signal for a respective filter branch. The successive taps of each filter branch is delayed by including first delays in an output of successive taps of each branch of the plurality of branches to account for filter pipelining delays. Second delays are included in successive taps of each branch to account for a phase delay between respective branches of the plurality of filter branches. The filtered sample substreams are stored in a plurality of output buffers. The plurality of output buffers correspond to the plurality of filter branches. Storing the generated output sample substreams includes determining an index of the output sample substream. The determined index is used as a memory address of the plurality of output buffers. The stored output sample substream is output from the memory address of the determined index as an output value. The stored output sample substreams are combined to generate the output sample stream.

In accordance with an aspect of this embodiment, determining an index of the output sample substream includes determining whether the output sample of the input sample stream is valid by $$\text{valid}_y(k) = \left\lceil \frac{(k+1)U}{D} \right\rceil - \left\lceil \frac{kU}{D} \right\rceil,$$

where k is the index of the input sample stream; U is the upsampling rate; D is the downsampling rate; y is the output stream; and $\lceil x \rceil$ is a ceiling function on x.

In accordance with another aspect of this embodiment, determining an index of the output sample substreams include determining whether an output sample of the input sample stream is valid. The set of filter coefficients correspond to the taps of each branch of the plurality of filter branches. An index of the output sample stream is incremented if the output sample is valid.

DETAILED DESCRIPTION

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

As used herein, relational terms, such as "first" and "second," "top" and "bottom," and the like, may be used solely to distinguish one entity or element from another entity or element without necessarily requiring or implying any physical or logical relationship or order between such entities or elements.

In embodiments described herein, the joining term, "in communication with" and "connected to," and the like, may be used to indicate electrical or data communication, which may be accomplished by physical contact, induction, electromagnetic radiation, radio signaling, infrared signaling or optical signaling, for example. The above methods of achieving electrical or data communication are non-limiting and mentioned only for illustration. One having ordinary skill in the art will appreciate that multiple components may interoperate and modifications and variations are possible of achieving the electrical and data communication.

Figure 1:
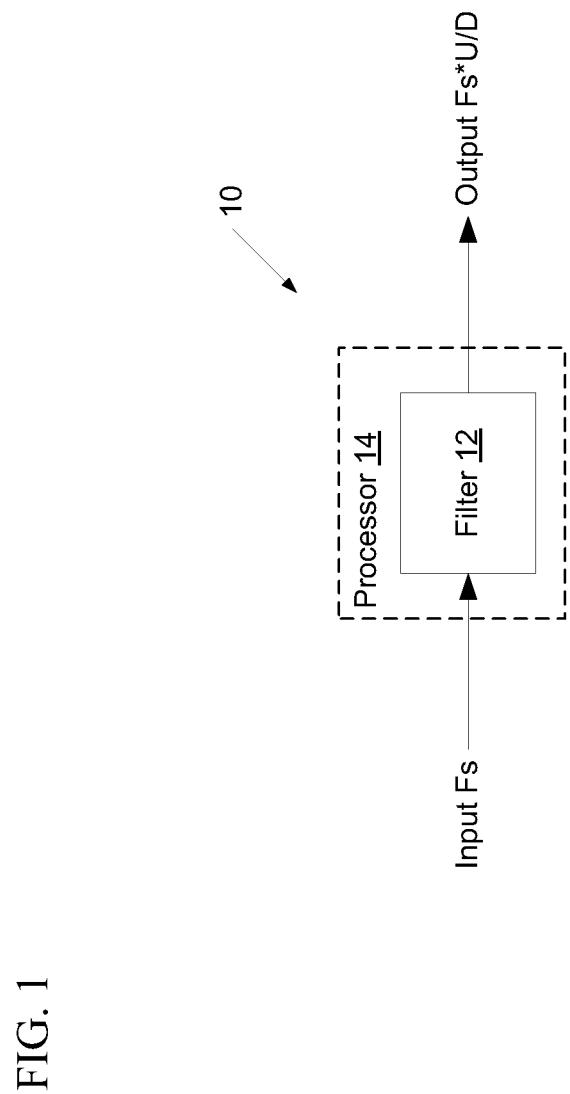
FIG. 1 is a block diagram of an exemplary rate change filter system constructed in accordance with principles of the present invention.

Referring to the drawing figures in which like reference designators refer to like elements, FIG. 1 shows a block diagram of an exemplary rate change filter system 10 according to an exemplary embodiment of the present invention. A filter 12 of the rate change filter system 10 receives an input signal having a frequency Fs and outputs a signal having a frequency Fs*U/D. According to some exemplary embodiments, the filter 12 may be implemented by a processor 14, which may include, for example, an Application Specific Integrated Circuit (ASIC) and a Field Programmable Gate Array (FPGA). The filter and/or processor may also include memory, such as non-transitory memory, for storing programmatic code and/or data associated with the implementation of the functions described herein.

Figure 2:
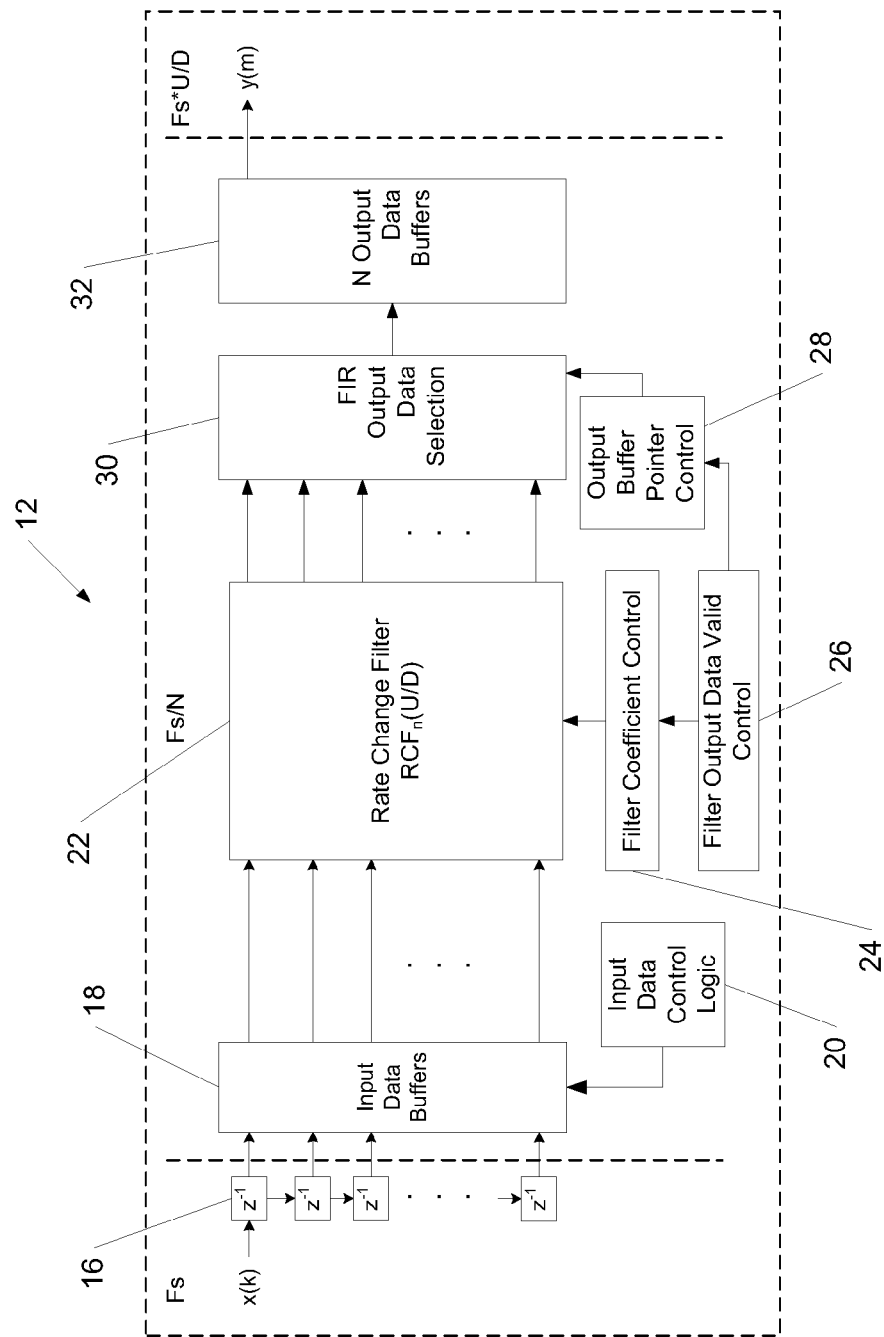
FIG. 2 is a detailed block diagram view of an exemplary rate change filter constructed in accordance with principles of the present invention, shown as a two branch system.

A detailed exemplary block diagram of the filter 12 is described with reference to FIG. 2. An input signal x(k) having a frequency Fs is delayed by a delay element 16 and input to an input data buffer 18. A number of delay elements 16 may delay the input signal x(k), to correspond to a number of taps or coefficients corresponding to phases of the filter 12 and are stored as input samples in the input data buffer 18. An input data control logic module 20 controls storing the input samples in the input data buffer 18. Each of the input sample streams of the input data buffer 18 are output to a Rate Change Filter (RCF) 22. The rate change filter 22 is controlled by a filter coefficient control module 24. A filter output data valid control module 26 is connected to the filter coefficient control 24 and is configured to determine valid filter coefficients of RCF 22.

The output of RCF 22 is transmitted to a Finite Impulse Response (FIR) output data selection module 30. The FIR output data selection module 30 is controlled by an output buffer pointer control 28, which includes input from the filter output data valid control 26. The output buffer pointer control 28 determines an address of the N Output Data Buffers 32 to save the selection of FIR output data 30, which are combined to output an output signal y(m) having a output frequency Fs*U/D. In accordance with principles of the present invention, U/D is less than 1.

From Eq. 1, the length of m is calculated as $$\left\lceil \frac{L_x \times U}{D} \right\rceil,$$

where $L_x$ is the length of the input stream x. Where k is the input stream index:

$$m = \left\lceil \frac{kU}{D} \right\rceil, \quad k \in [0: L_x - 1]. \quad \text{(Eq. 3)}$$

An output of the FIR Rate Change Filter shown in Eq. 1 with respect to the input stream index can then be rewritten as:

$$y(k) = \sum_{n=0}^{Ntap-1} h\left(nU + \left\lceil \frac{kU}{D}\right\rceil D - \left\lfloor \frac{\left\lceil \frac{kU}{D}\right\rceil D}{U}\right\rfloor U\right) \times x\left(\left\lfloor \frac{\left\lceil \frac{kU}{D}\right\rceil D}{U}\right\rfloor - n\right), \quad \text{(Eq. 4)}$$

$$k \in [0: L_x - 1].$$

Because the targeted ratio for the RCF rate requires that $$\frac{U}{D}$$

is less than one, the U factor is always smaller than the D factor. If U=D, Eq. 3 reduces to m=k, which bounds the increment step of the m index to no more than one for each k index. One having ordinary skill will recognize that as the k index increments from one cycle to another, the output stream index m increments or remains the same value at a rate dependent on the ratio of $$\frac{U}{D}.$$

Figure 3:
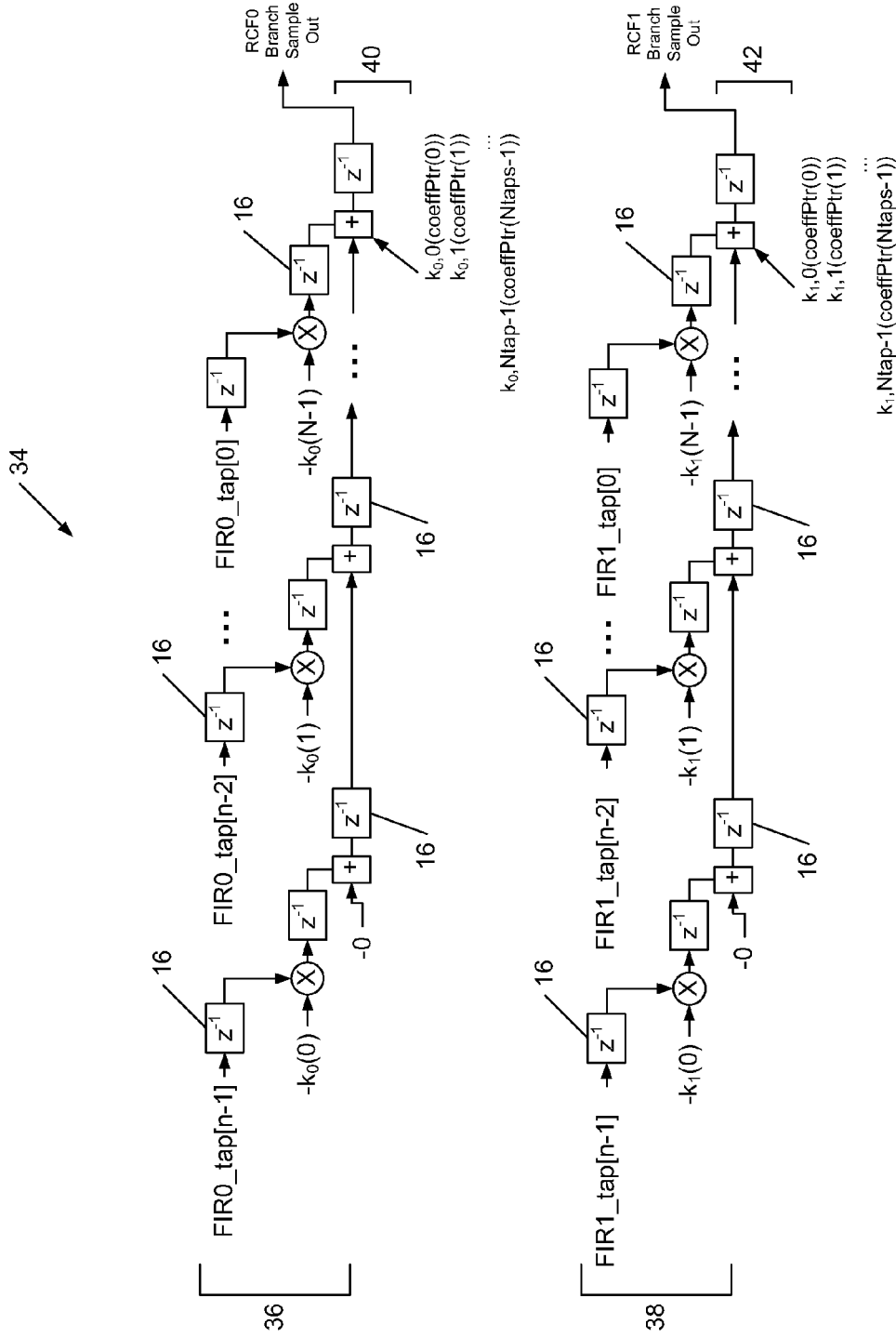
FIG. 3 is a block diagram of a multi-branch systolic filter in accordance with principles of the present invention, shown as a two branch system.

A block diagram of a multi-branch systolic filter 34 having two branches 36 and 38 is shown according to an exemplary embodiment with reference to FIG. 3. The first branch 36 includes n tap inputs FIR0_tap[n−1] through FIR0_tap[0] sampled at a first time $t_0$. Each input FIR0_tap is delayed by delay element 16 and convolved with N impulse coefficients $k_0(0)$ through $k_0(N-1)$. A result of each convolution is delayed, at each stage, by a delay element 16 and summed in a first pipeline 40. The output of the first pipeline 40 is a first sample output series for the first branch 36. The second branch 38 includes n tap inputs FIR1_tap[n−1] through FIR1_tap[0] sampled at a second time $t_1$. Each input FIR1_tap is delayed by delay element 16 and convolved with N impulse coefficients $k_1(0)$ through $k_1(N-1)$. A result of each convolution is delayed by a delay element 16 and summed in a second pipeline 42. The output of the second pipeline 42 is a second sample output series for the second branch 38. Delay elements 16 for tap inputs FIR0_tap and FIR1_tap ensure that the tap coefficients are properly sampled for the corresponding samples for phases of a branch cycle.

It will be appreciated that although the exemplary embodiment of systolic filter 34 shows a two-branch systolic filter, more than two branches may be implemented.

Figure 4:
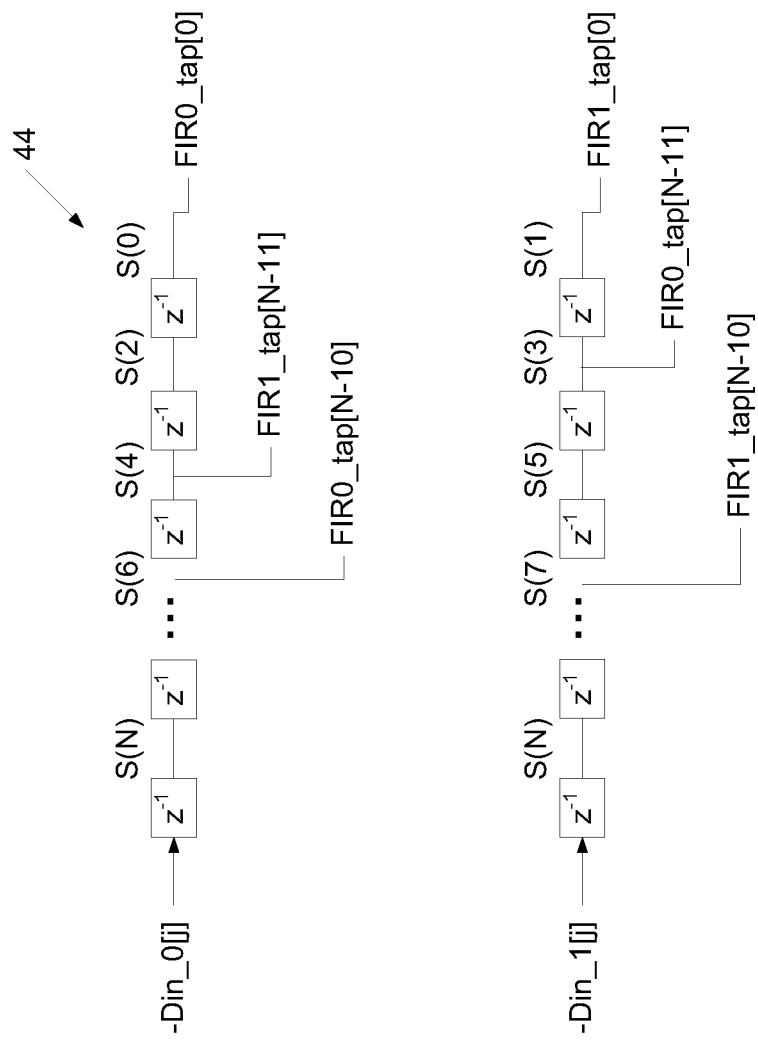
FIG. 4 is a block diagram of FIR tap delays for a multi-branch rate change filter in accordance with principles of the present invention, shown as a two branch system.

A block diagram of the FIR tap delays for the multi-branch rate change filter is shown according to an exemplary embodiment with reference to FIG. 4. According to an exemplary embodiment, the FIR RCF 22 has, for example, 12 taps (Ntap=12), and, for example, two branches. The appropriate input samples are aligned to the input filter branches to take into account a systolic pipelining delay and phase delay of the branch cycle. It can be shown, in this exemplary embodiment, that data input to the systolic filter pipeline, Din_0[j], is delayed for FIR0_tap[11:0][j] by [S((n−1)*3), S((n−2*3), . . . S(3), S(0)], for the first branch where the number of taps is 0:NTaps−1, and j is the tap index. The delay structure for FIR1_tap[11:0][j] is [S((n−1)*3+1), S((n−2)*3+1), . . . S(4), S(1)], for the second branch where the number of taps is 0:NTaps−1, and j is the tap index.

According to a generic exemplary embodiment having NTaps taps and N branches, it can be shown that for FIRi_tap [Ntaps−1:0], the delay structure is [S((n−1)*3+i), . . . S(0)] for i=0:N−1 and n=0:Ntaps−1.

For k+1 indices where m does not increment compared to the k index, the summation of the filter in Eq. 4 is not valid. It is therefore, necessary to determine a valid index for k. If $$\left\lceil \frac{(k+1)U}{D}\right\rceil - \left\lceil \frac{kU}{D}\right\rceil = 1, y(k)$$

is valid, otherwise y(k) is not valid:

$$\text{valid}_y(k) = \left\lceil \frac{(k+1)U}{D}\right\rceil - \left\lceil \frac{kU}{D}\right\rceil. \quad \text{(Eq. 5)}$$

The ceiling function may be converted to floor functions and modulo functions using the following properties:

$$\left\lceil \frac{n}{m}\right\rceil = \left\lfloor \frac{n+m-1}{m}\right\rfloor = \left\lfloor \frac{n-1}{m}\right\rfloor + 1; \text{ and}$$

$$x \bmod y = x - y\left\lfloor \frac{x}{y}\right\rfloor; \text{ or, conversely } \left\lfloor \frac{x}{y}\right\rfloor = \frac{x - x \bmod y}{y}.$$

Eq. 5 then may reduce to:

$$\text{valid}_y(k) = \left\lceil \frac{(k+1)U}{D}\right\rceil - \left\lceil \frac{kU}{D}\right\rceil;$$

$$= \left\lfloor \frac{(k+1)U - 1}{D}\right\rfloor - \left\lfloor \frac{kU - 1}{D}\right\rfloor;$$

-continued $$= \frac{[((k+1)U-1) - ((k+1)U-1)\mathrm{mod}D] - [(kU-1) - (kU-1)\mathrm{mod}D]}{D};$$

and finally, $$\mathrm{valid}_y(k) = \frac{U - ((k+1)U-1)\mathrm{mod}D + (kU-1)\mathrm{mod}D}{D}. \quad (\text{Eq. 6})$$

For $\mathrm{valid}_y(k)=1$, Eq. 6 reduces to:

$$D-U=(kU-1)\mathrm{mod}\, D-((k+1)U-1)\mathrm{mod}\, D). \quad (\text{Eq. 7})$$

A modified modulo-D counter may be used to indicate whether the output index m of the filter is valid or not for the particular input index k. The modified modulo-D counter is equivalent to $(kU-1)\mathrm{mod}\, D$, and increments by U each $k^{th}$ sample. One having ordinary skill will recognize that when k is equal to or greater than the difference of D and U, the modified modulo-D counter will roll over for the k+1 sample, and $$\left\lceil \frac{(k+1)U-1}{D} \right\rceil$$

would increment. Another way of describing whether y(k) is valid is by determining when the modified modulo-D counter will rollover:

If $(kU-1)\mathrm{mod}(D)\geq D-U$, $\mathrm{valid}_y(k)=1$ else $\mathrm{valid}_y(k)=0$. (Eq. 8)

The $\mathrm{valid}_y(k)$ determines when to increment the coefficient index m and may also be used to determine when the filter output sample is written to the output data buffer 32. In the exemplary embodiment where N=2, the data valid signal has to be calculated for two samples within the same clock period, therefore two branches of modulo counters are used in determining a buffer control:

$\mathrm{CtrBr0}(j)=((2j)U-1)\mathrm{mod}(D)=(k_0 U-1)\mathrm{mod}(D)$, $\mathrm{CtrBr1}(j)=((2j+1)U-1)\mathrm{mod}(D)=(k_1 U-1)\mathrm{mod}(D)$. (Eq. 9)

$k_0=2j$, for $k_1=2j+1$, $\in j=[0:1:(L_x-1)/2]$.

If $\mathrm{CtrBr0}(j)\geq D-U$, $\mathrm{valid}_{y0}(j)=1$, else $\mathrm{valid}_{y0}(j)=0$; and (Eq. 10)

If $\mathrm{CtrBr1}(j)\geq D-U$, $\mathrm{valid}_{y1}(j)=1$, else $\mathrm{valid}_{y1}(j)=0$. (Eq. 11)

For a generic N-branch design, N branches of modulo counters may be used that will increment N*U. The equations for the generic N-branch design can be written as:

$\mathrm{CtrBr}_n(j)=((2j+n)U-1)\mathrm{mod}(D)=((k_n)U-1)\mathrm{mod}(D)$,
$\in n=0:1:N-1$; (Eq. 12)

for $k_n=Nj+n$, $\in j=[0:1:(L_x-1)/N]$.

If $\mathrm{CtrBr}_n(j)\geq D-U$, $\mathrm{valid}_{y(n)}(j)=1$, else $\mathrm{valid}_{y(n)}(j)=0$, where $n=0:N-1$. (Eq. 13)

According to another exemplary embodiment, a modified modulo-D counter could directly implement a ceiling function as shown in Eq. 5. Such an implementation would require more complex hardware than a modulo counter and may require careful handling of the k index counter to ensure correct calculation of $\mathrm{valid}_y(k)$ when the k index overflows the counter depth.

According to some exemplary embodiments, reloadable and time-varying coefficients are used to implement efficient rate change filters. The phase of the coefficients is dependent on the input sample index as described herein:

$$nU + \left\lceil \frac{kU}{D} \right\rceil D - \left\lfloor \frac{\left\lceil \frac{kU}{D} \right\rceil D}{U} \right\rfloor U = nU + \left\lceil \frac{kU}{D} \right\rceil D\mathrm{mod}U \quad (\text{Eq. 14})$$

$$= nU + \mathrm{coeffPtr},$$

where $\mathrm{coeffPtr} = \left\lceil \frac{kU}{D} \right\rceil D\mathrm{mod}U.$ (Eq. 15)

Because coeffPtr(k+1) only increments if $$\left\lceil \frac{(k+1)U}{D} \right\rceil$$

increments or when $\mathrm{valid}_y(k)$ as shown in Eq. 5, the $\mathrm{valid}_y(k)$ is used to determine when to increment the coefficient index.

For an exemplary embodiment of N=2, the two branches of coefficient index coeffPtrBr0 and coeffPtrBr1 can be rewritten as:

$$k_0 = 2j, \quad (\text{Eq. 16})$$

$$k_1 = 2j+1, \in j = [0:1:(L_x-1)/2],$$

$$\mathrm{coeffPtrBr0}(j) = \left\lceil \frac{2jU}{D} \right\rceil D\mathrm{mod}U = \left\lceil \frac{k_0 U}{D} \right\rceil D\mathrm{mod}U,$$

and $$\mathrm{coeffPtrBr1}(j) = \left\lceil \frac{(2j+1)U}{D} \right\rceil D\mathrm{mod}U = \left\lceil \frac{k_1 U}{D} \right\rceil D\mathrm{mod}U.$$

For a generic N-branch design, the equations can be written as:

$$k_n = Nj+n, \in j = [0:1:(L_x-1)/N], \quad (\text{Eq. 17})$$

$$n = 0:1:N-1;$$

$$\mathrm{coeffPtrBr}_n(j) = \left\lceil \frac{(Nj+n)U}{D} \right\rceil D\mathrm{mod}U$$

$$= \left\lceil \frac{k_n U}{D} \right\rceil D\mathrm{mod}U.$$

The coefficient index increments only when the filter output is valid since the output m index increments only when the filter output is valid. Thus, the coeffPtrBr0 modulo counter is incremented by 2*D if both $\mathrm{valid}_{y0}(j)$ and $\mathrm{valid}_{y1}(j-1)$ are equal to 1. The coeffPtrBr0 modulo is incremented by D if one of $\mathrm{valid}_{y0}(j)$ and $\mathrm{valid}_{y1}(j-1)$ is equal to 1, and by 0 if neither $\mathrm{valid}_{y0}(j)$ nor $\mathrm{valid}_{y1}(j-1)$ is valid. For a two-branch embodiment, this can be described by:

$\mathrm{coeffPtrBr0}(j)=(\mathrm{coeffPtrBr0}(j-1)+(\mathrm{valid}_{y0}(j)+\mathrm{valid}_{y1}(j-1))*D)\mathrm{mod}\, U$, $\mathrm{coeffPtrBr1}(j)=(\mathrm{coeffPtrBr1}(j-1)+(\mathrm{valid}_{y1}(j)+\mathrm{valid}_{y0}(j))*D)\mathrm{mod}\, U.$ (Eq. 18)

Written generically for a N-branch design, the coefficient pointers can be calculated as:

$$coeffPtrBr_n(j) = \left(coeffPtrBr_n(j-1) + \left(\sum_{i=0}^{n} \text{valid}_{y(i)}(j) + \sum_{p=n+1}^{N-1} \text{valid}_{y(p)}(j-1)\right) * D\right) \bmod U, \quad \text{(Eq. 19)}$$

$$\in n = 0:1:N-1$$

Figure 5:
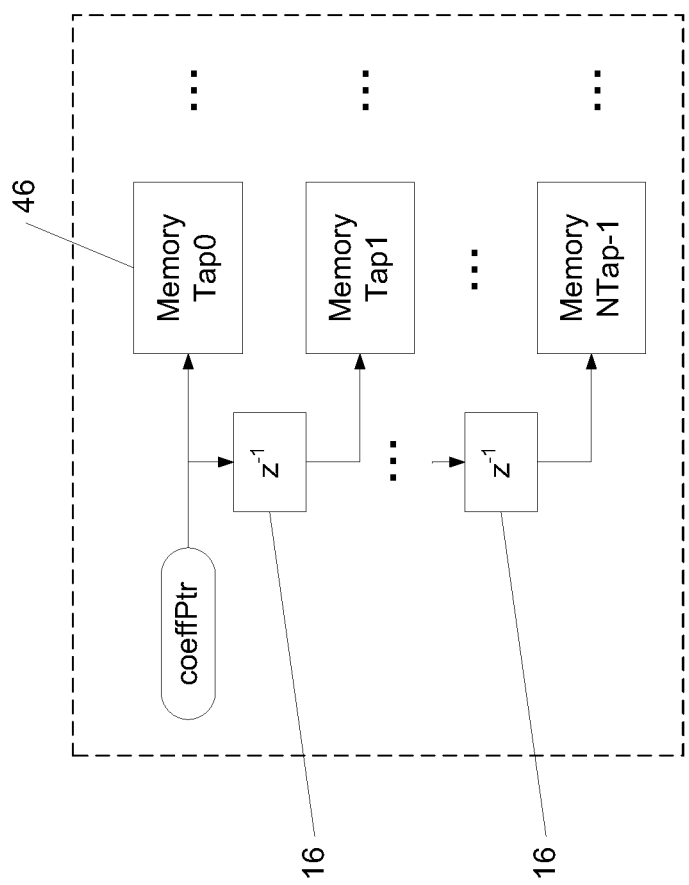
FIG. 5 is a block diagram of coefficient memory addressing in accordance with principles of the present invention.

The $coeffPtrBr_n$ coefficient index is used as an address to read the appropriate value from the coefficient stored in memory with reference to FIG. 5. FIG. 5 shows the coeffPtr-$Br_n$ indices stored in memories for a branch n of a multiple branch RCF. The coefficients for the branch are saved in memory 46, for taps 0 to NTaps−1, in memory Tap0 to NTap−1 respectively, and include delays 16 to account for the pipelining within the RCF Systolic FIR Filter stages shown in FIG. 3. Coefficients for Tap0 are provided with a delay of zero; coefficients for Tap1 are provided with a delay of one sample; coefficients for Tap2 (not pictured) are provided with a delay of two samples; and so on until the coefficients for NTap−1, which are provided with a delay of NTap−1 samples.

An alternative method to using a modified modulo counter in Eq. 19, would be to directly implement a ceiling function as shown in Eq. 16. Such a method would require more complex hardware than a modulo counter and would require careful handling of the $j^{th}$ index counter for when it overflows the counter depth to ensure $coeffPtrBr_n$ is calculated correctly. In exemplary embodiments, the increment is bounded and appropriate counter depths may be chosen to ensure that no overflow conditions occur.

According to some exemplary embodiments, the majority of the RCF 22 is implemented at a higher clock rate than the input data buffers 18 to simplify input data design and allow for flexible $$\frac{U}{D}$$

ratios. An output buffer is used for clock domain transfer to the lower rate. According to exemplary embodiments, there are as many output buffers as FIR branches, each output buffer having separate write control logic. The output write control logic uses the valid signals from Filter Output Data Valid Control 26 for the FIR outputs to determine when and which buffer of the N Output Data Buffers 32 to write the filter branch outputs. According to an exemplary embodiment having a two-branch RCF (N=2), a write pointer for FIR Br0 writePtrBr0 in Output Buffer Pointer Control 28 is incremented by:

0 if both $\text{valid}_{y0}(j)$ or $\text{valid}_{y1}(j-1)$ are not valid (0);
    +1 if only one of $\text{valid}_{y0}(j)$ or $\text{valid}_{y1}(j-1)$ is valid (1); and
    +2 if both $\text{valid}_{y0}(j)$ and $\text{valid}_{y1}(j-1)$ are valid.

A write pointer for FIR Br1 writePtrBr1 in Output Buffer Pointer Control 28 is incremented by:

0 if both $\text{valid}_{y1}(j)$ or $\text{valid}_{y0}(j)$ are not valid (0);
    +1 if only one of $\text{valid}_{y1}(j)$ or $\text{valid}_{y0}(j)$ is valid (1); and
    +2 if both $\text{valid}_{y1}(j)$ and $\text{valid}_{y0}(j)$ are valid.

For a generic N-branch implementation, a write pointer $writePtrBr_n$ in Output Buffer Pointer Control 28 can be written as:

$$writePtrBr_n(j) = \quad \text{(Eq. 20)}$$
$$\left(writePtrBr_n(j-1) + \left(\sum_{i=0}^{n} \text{valid}_{y(i)}(j) + \sum_{p=n+1}^{N-1} \text{valid}_{y(p)}(j-1)\right)\right),$$
$$\in n = 0:1:N-1$$

In an exemplary embodiment having a two-branch RCF, where N=2, there are two output buffers Buffer0 and Buffer1 in Output Data Buffers 32. A LSB (Least Significant Bit) of write pointer writePtrBr0 selects which buffer phase the FIR output will be written to. If the LSB equals 0, then Buffer0 is selected; otherwise Buffer1 is selected:

$$bufferSelBr0(j) = writePtrBr0(j) \bmod 2; \text{ and} \quad \text{(Eq. 21):}$$

$$bufferSelBr1(j) = writePtrBr1(j) \bmod 2.$$

Buffer0 data is then selected from the appropriate FIR branch and writing is enabled to Buffer0 if:

$\text{valid}_{y0}(j)$ and $bufferSelBr0(j)=0$, or $\text{valid}_{y1}(j)$ and $bufferSelBr1(j)=0$.

If Buffer1 data is selected from the appropriate FIR branch and writing is enabled to Buffer1 if:

$\text{valid}_{y0}(j)$ and $bufferSelBr0(j)=1$, or $\text{valid}_{y1}(j)$ and $bufferSelBr1(j)=1$.

For a generic N-branch embodiment, the buffer select for the FIR output branch can be described as:

$$bufferSelBr_n(j) = writePtrBr_n(j) \bmod N, \in n=0:1:N-1. \quad \text{(Eq. 22):}$$

The $\text{Buffer}_n$ write enable is active if:

$\text{valid}_{y0}(j)$ and $bufferSelBr0(j)=n$; or $\text{valid}_{y1}(j)$ and $bufferSelBr1(j)=n$; or $\text{valid}_{y(N-1)}(j)$ and $bufferSelBr(N-1)(j)=n$.

Output Buffer Pointer Control 28 increments the buffer write address when the write enable is active. If there is no valid data for a particular $j^{th}$ sample, the $\text{Buffer}_n$ write address is not incremented. The $\text{Buffer}_n$ input data is determined by the FIR Output Data Selection 30 based on branch x where $bufferSelBr_x(j)=n$ and $\text{valid}_{y(k)}(1)=1$. Because valid output data is written sequentially to the N Output Data Buffers 32, the read control logic may be based on the Nth buffer write pointer $writePtrBr_{N-1}(j)$, and may be common for all of the output branches if the clock rate is $$\frac{Fs}{N} * \frac{U}{D}.$$

One method of incrementing a read output readPtr(j) is to wait until a difference between the $writePtrBr_{N-1}(j)$ and readPtr(j) is greater than an allowable fill level. When the difference is greater than the allowable fill level, the data is read out of all N buffers at readPtr(j) simultaneously, and readDataValid(j)=1, otherwise readDataValid(j)=0. It will be appreciated that if the output clock rate is $$\frac{Fs}{N} * \frac{U}{D},$$

readDataValid(j) will always be 1 once the buffer has reached the desired fill level.

According to another exemplary embodiment, a single output buffer may be used instead of N output buffers 32. The single output buffer may have N*output data width instead of N buffers at a single data output width. The FIR Output Data Selection 30 would need to pre-buffer N valid output data samples before writing to the final output data buffer. Therefore, N valid output data samples are written at the same time. This would add more latency to the data path through the filter 12, however, and may be more efficient for address and write control logic as N increases.

Figure 6:
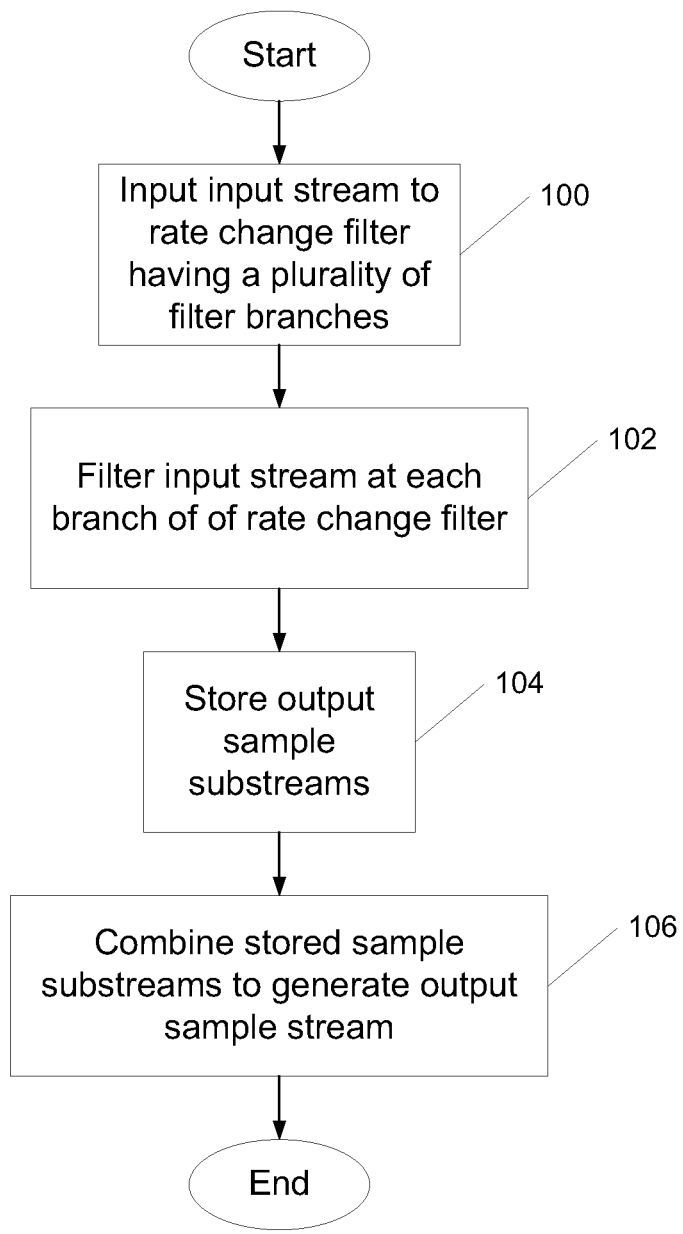
FIG. 6 is flow chart of an exemplary process of filtering an input stream to produce an output stream in accordance with principles of the present invention.

An exemplary flow chart of a process of down converting an input signal, x(k), using a multi-branch rate change filter 22 is described with reference to FIG. 6. The input signal, x(k), is input (block 100) to the rate change filter 22. The rate change filter 22 includes multiple filter branches, i.e., two or more branches, each branch having a finite impulse response filter. The input signal, x(k), is filtered at each branch of the rate change filter 22 (block 102). The filtered output values are stored in the output data buffers 32 as output sample substreams (block 104). The stored output sample substreams may be combined to generate an output signal, y(m) (block 106). According to some exemplary embodiments, the output signal is not required to be re-serialized to the full rate of Fs*U/D depending on the hardware constraints.

Figure 7:
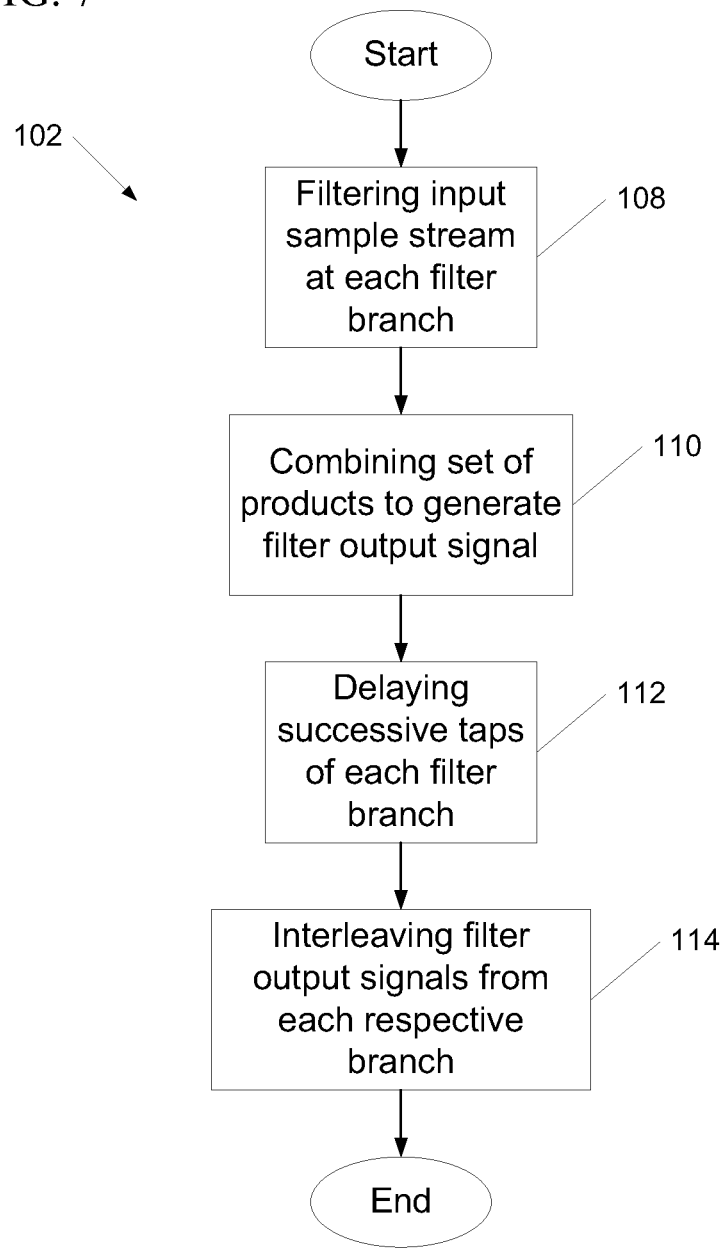
FIG. 7 is a flow chart of an exemplary process of filtering the input signal using a finite impulse response filter in accordance with principles of the present invention.

An exemplary detailed flow chart of filtering the input signal using a finite impulse response filter of the rate change filter 22 (block 102) is described with reference to FIG. 7. The input sample stream is filtered (block 108) at each branch of a multi-branch RCF 22. More specifically, for example, a first sample of the input sample stream is filtered at each tap of a first branch of the multi-branch RCF 22. And a second sample of the input sample stream is filtered at each tap of a second branch of the multi-branch RCF 22. The filtered output of each tap is combined (block 110) in the RCF 22 to generate a filtered output signal. An output of each tap of each branch of the multi-branch RCF 22 is delayed (block 112) in the RCF 22 to account for filtering pipeline delays. The output buffer pointer control 28 of each tap of each branch is combines or interleaves (block 114) the filtered output of each tap of each branch with the filtered outputs of the taps of at least one other branch of the multi-branch RCF 22. In this way, a finite impulse response of the input signal, x(k), is produced.

Figure 8:
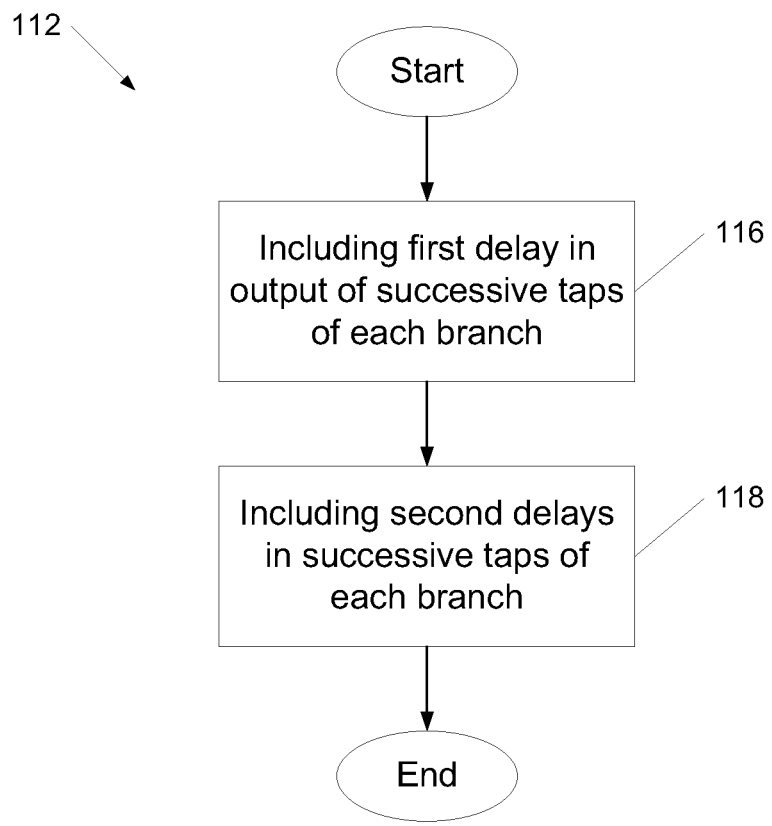
FIG. 8 is a flow chart of an exemplary process of accounting for pipelining delays and for the phase of the input signal in accordance with principles of the present invention.

An exemplary detailed flow chart of delaying the output of each tap of each branch (block 112) to account for pipelining delays and for the phase delays of the filter coefficients applied to the input signal is described with reference to FIG. 8. To account for phase delays of the input signal and pipelining delays of a systolic filter, the RCF 22 inserts delays in the input signal and filtered outputs of each tap. A first delay is included in an output (block 116) of each filtered tap coefficient to account for phase delays of the tap coefficients used in filtering the input signal. The pipeline signal, which is a combined output signal from taps of a filter branch, includes a second delay (block 118) between successive taps of a filter branch to account for delays caused by pipelining.

Figure 9:
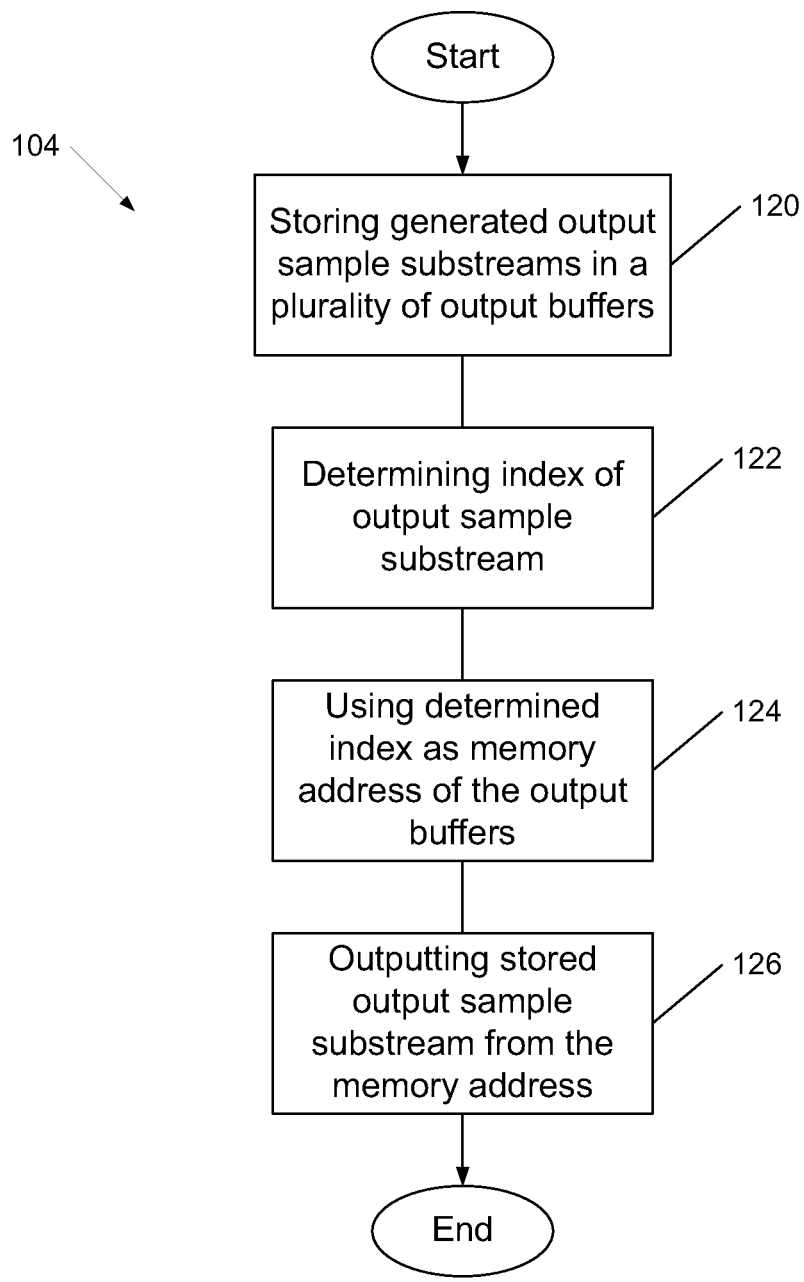
FIG. 9 is a flow chart of an exemplary process of storing the filtered output sample substreams in the output data buffers in accordance with principles of the present invention.

An exemplary detailed flow chart of storing the output sample substreams (block 104) in the output data buffers 32 is described with reference to FIG. 9. The output sample substreams, which include a series of filtered coefficients, are stored (block 120) in multiple output buffers 32 by the FIR output data selection 30 of the filter 12. Based on the output buffer pointer control 28, the output data selection 30 determines the index of the output buffer 32 for the output sample substream (block 122) from the multi-branch RCF 22. The FIR output data selection 30 uses the determined index when saving the output sample substream to the output buffer 32 (block 124). The stored output sample substream is then output (block 126) from the output buffer 32 to produce the output signal, y(m).

Figure 10:
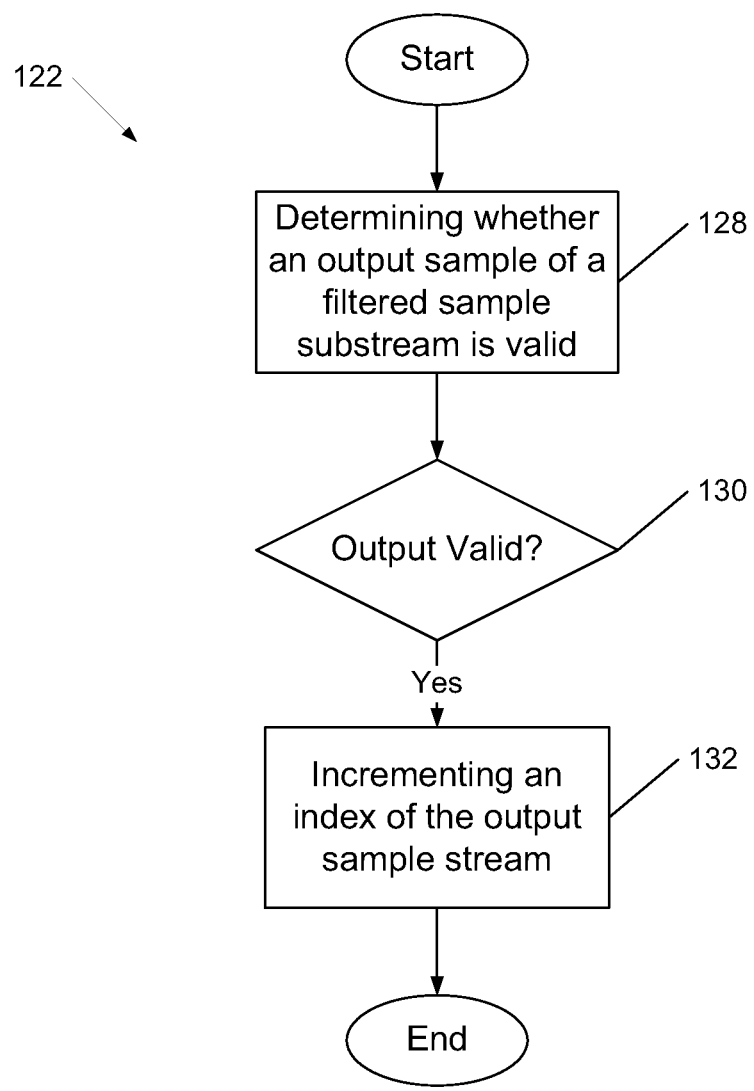
FIG. 10 is a flow chart of an exemplary process of determining an index of the output sample stream in accordance with principles of the present invention.

An exemplary detailed flow chart of determining an index of the output sample stream (block 122) for the output data buffers 32 is described with reference to FIG. 10. The filter output data valid control 26 determines whether an output of the input coefficient is valid (block 128). In other words, a determination is made whether the output index of the filter is valid or not. If the output index of the filter is valid (block 130), an index of the output sample stream corresponding to a branch of the multi-branch RCF 22 is incremented (block 132).

In one exemplary embodiment, the system 10 can be implemented in ASICs, FPGAs or any sort of digital signal processor that can convert the sample rate of a signal by a fractional ratio, as for example, between a modem and a radio in a wireless telecommunication system. These two sub-systems may operate at two different sampling rates, where the receiving sub-system has a maximum internal operating frequency less than Fs*U/D. Either sub-system could be implemented in an ASIC, FPGA, or other digital signal processor, along with suitable memory, where maximum operating frequencies are highly dependent on the device technology. For example, there may be a system that has a transmitting subsystem operating at a sampling rate of Fs=1 Gsps, and a receiver sub-system that is required to process the sampled data at Fs*U/D=1 G*40/50=800 Msps. The receiving subsystem is implemented in an FPGA with a maximum internal operating frequency of Fp=200 MHz. To process the sampled RF data as required, and still achieve timing in the FPGA, the minimum number of branches required would be Fs/Fp=5.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method of filtering an input sample stream having a downsampling rate to generate an output sample stream having an upsampling rate less than the downsampling rate, the method comprising:
inputting the input sample stream to a rate change filter having a plurality of filter branches;
filtering the input sample stream at each of the plurality of filter branches to output filtered sample substreams, each of the plurality of filter branches having filter coefficients corresponding to a different phase of the filter response;
storing the filtered sample substreams in a memory; and
combining the stored filtered sample substreams to generate the output sample stream.

2. The method of claim 1, wherein filtering the input sample stream at each of the plurality of filter branches comprises:
multiplying, during successive taps of a clock cycle, the input sample stream input of each filter branch by a set of filter coefficients to generate a set of products; and
combining the set of products to generate a filter output signal for a respective filter branch.

3. The method of claim 2, wherein filtering the input sample stream in each of the plurality of filter branches further comprises:
delaying the successive taps of each filter branch; and
interleaving the filter output signals from each respective branch.

4. The method of claim 3, wherein the plurality of filter branches includes a finite impulse response filter, and wherein delaying the successive taps comprises:
including first delays in an output of successive taps of each branch of the plurality of branches to account for filter pipelining delays; and
including second delays in successive taps of each branch to account for a phase delay between taps of each branch of the plurality of filter branches.

5. The method of claim 1, wherein storing the filtered sample substreams in the memory comprises:
determining whether an output sample of a filtered sample substream is valid based on an index of the input sample stream, the filter coefficients corresponding to taps of each branch of the plurality of filter branches; and
incrementing an index of the output sample stream if the output sample of the filter branch is valid.

6. The method of claim 5, wherein determining whether the output sample is valid is based on an index of the input sample stream, the upsampling rate and the downsampling rate.

7. The method of claim 6, wherein determining whether the output sample is valid is determined by, $$\text{valid}_y(k) = \left\lceil \frac{(k+1)U}{D} \right\rceil - \left\lceil \frac{kU}{D} \right\rceil,$$

wherein,
k is the index of the input sample stream;
U is the upsampling rate;
D is the downsampling rate;
y is the output stream; and
$\lceil x \rceil$ is a ceiling function on x.

8. The method of claim 5, wherein storing the filtered sample substreams in the memory comprises:
storing the generated output sample substreams in a plurality of output buffers, the plurality of output buffers corresponding to the plurality of filter branches, storing the generated output sample substreams including:
determining an index of the output sample substream;
using the determined index as a memory address of the plurality of output buffers; and
outputting the stored output sample substream from the memory address of the determined index as an output value.

9. The method of claim 5, further comprising:
storing the generated output sample substreams in a plurality of output buffers, wherein the plurality of output buffers correspond to the plurality of filter branches; and
using the determination that the output sample is valid as write control logic to determine the buffer address to write the filter branch outputs.

10. A rate change filter for filtering an input sample stream having a first sample rate to generate an output stream having a second sample rate less than the first sample rate, the rate change filter comprising:
a plurality of branches of a rate change filter, each of the plurality of branches having an offset state to filter the input sample stream using filter coefficients in each branch corresponding to different phases and to generate multiple output substreams;
an input control circuit configured to control input of the input sample stream to each of the plurality of branches of the rate change filter;
a filter control circuit configured to control filter coefficients of the rate change filter to output filtered sample substreams; and
an output control circuit configured to:
control output of sample substreams generated at each of the plurality of branches of the rate change filter;
determine whether an output sample is valid based on an index of the input sample stream;
update the coefficient index of each branch of the plurality of branches; and
increment an index of the output sample stream if the output sample is valid.

11. The rate change filter of claim 10, wherein each branch of the plurality of filter branches is configured to:
multiply, during successive taps of a clock cycle, the input sample stream fed to each filter branch by a set of filter coefficients to generate a set of products; and
combine the set of products to generate a filtered output substream for a respective branch.

12. The rate change filter of claim 11, each branch of the plurality of filter branches further configured to:
delay the successive taps of each branch by:
including first delays in an output of each of the successive taps of each branch to account for filter pipelining delays; and
including second delays in an input of each of the successive taps of each branch to account for a phase delay between respective branches of the plurality of filter branches; and
interleave the output signals from each respective branch.

13. The rate change filter of claim 10, wherein the output control circuit is further configured to determine whether an output sample is valid based on an index of the input sample stream, the first sample rate and the second sample rate.

14. The rate change filter of claim 10, wherein the output control circuit is further configured to:

store the generated output sample substreams in a plurality of output buffers, the plurality of output buffers corresponding to the plurality of filter branches of the rate change filter.

15. The rate change filter of claim 14, wherein the output control circuit is further configured to store the generated output sample substreams by:
    determining an index of the output sample substream;
    use the determined index as a memory address of the plurality of output buffers; and
    output the stored output sample substream from the memory address of the determined index as an output value.

16. The rate change filter of claim 10, wherein the output control circuit is further configured to:
    store the generated output sample substreams in a plurality of output buffers, the plurality of output buffers corresponding to the plurality of filter branches by:
        using the determination that the output sample is valid in determining when and to which buffer to write the filter branch outputs.

17. A method of filtering an input sample stream having a first sample rate to generate an output sample stream having a second sample rate less than the first sample rate, the method comprising:
    inputting the input sample stream to a rate change filter having a plurality of filter branches;
    filtering the input sample stream at each of the plurality of filter branches to output filtered sample substreams, each of the plurality of filter branches having filter coefficients corresponding to a different phase of the filter response, the filtering including:
        multiplying, during successive taps of a clock cycle, the input sample stream input to each filter branch by a set of filter coefficients to generate a set of products;
        combining the set of products to generate a filter output signal for a respective filter branch; and
        delaying the successive taps of each filter branch by:
            including first delays in an output of successive taps of each branch of the plurality of branches to account for filter pipelining delays; and
            including second delays in successive taps of each branch to account for a phase delay between respective branches of the plurality of filter branches;
    storing the filtered sample substreams in a plurality of output buffers, the plurality of output buffers corresponding to the plurality of filter branches, storing the generated output sample substreams including:
        determining an index of the output sample substream;
        using the determined index as a memory address of the plurality of output buffers; and
        outputting the stored output sample substream from the memory address of the determined index as an output value; and
    combining the stored output sample substreams to generate the output sample stream.

18. The method of claim 17, wherein determining an index of the output sample substream includes determining whether an output sample of the input sample stream is valid by $$\text{valid}_y(k) = \left\lceil \frac{(k+1)U}{D} \right\rceil - \left\lceil \frac{kU}{D} \right\rceil$$

wherein,
    k is the index of the input sample stream;
    U is the upsampling rate;
    D is the downsampling rate;
    y is the output stream; and
    $\lceil x \rceil$ is a ceiling function on x.

19. The method of claim 17, wherein determining an index of the output sample substreams comprises:
    determining whether an output sample, based on an index of the input sample stream, is valid, the set of filter coefficients corresponding to the taps of each branch of the plurality of filter branches; and
    incrementing an index of the output sample stream if the output sample is valid.

* * * * *